United States Patent [19]
Sugai

[11] Patent Number: 6,083,832
[45] Date of Patent: Jul. 4, 2000

[54] METHOD OF MANUFACTURING SEMICONDUCTOR DEVICE

[75] Inventor: Kazumi Sugai, Tokyo, Japan

[73] Assignee: NEC Corporation, Japan

[21] Appl. No.: 09/175,932

[22] Filed: Oct. 20, 1998

[30] Foreign Application Priority Data

Oct. 21, 1997 [JP] Japan ................................. 9-288292

[51] Int. Cl.[7] .................................................. H01L 21/44
[52] U.S. Cl. ........................ 438/672; 438/652; 438/669; 438/680; 438/681; 438/688; 438/945; 438/970
[58] Field of Search ................................... 438/672, 652, 438/669, 680, 681, 688, 945, 970

[56] References Cited

U.S. PATENT DOCUMENTS 5,976,970  11/1999  Dalal et al. ............................. 438/637

OTHER PUBLICATIONS

"A low temperature CVD Al plug and interconnect process for 0.25 um metallization technologies" Fiordalice et al. IEEE; 1996 Symposium on VLSI Technology DIgest of Technical Papers; pp. 42–43.

*Primary Examiner*—John F. Niebling
*Assistant Examiner*—David A. Zarneke
*Attorney, Agent, or Firm*—Hayes, Soloway, Hennessey, Grossman & Hage, P.C.

[57] ABSTRACT

In a method of manufacturing semiconductor device, an aluminum film and a barrier metal film are formed on a semiconductor substrate and then an interlayer insulation film 15 is formed over the aluminum film and the barrier metal film. Then a PVD-Al film is formed over the entire upper surface of the interlayer insulation film by PVD, whereupon the PVD-Al film the interlayer insulation film are etched to open via holes, exposing part of the upper surface of the barrier metal film. Subsequently, via plugs are formed by filling metal, which includes aluminum, in the via holes by selective CVD with masking by a native oxide film formed on the upper surface of the PVD-Al film whereupon the native oxide film is removed by etching. Then a CVD-Al is formed over the entire upper surface of the PVD-Al film and the via plugs by CVD.

20 Claims, 3 Drawing Sheets

- 15; interlayer insulation film
- 14; barrier metal film
- 13; aluminum (Al) film
- 12; interlayer insulation film
- 11; semiconductor substrate (silicon)

- 16; PVD-Al film
- 15
- 14
- 13
- 12
- 11

- 17; via hole
- 16
- 15
- 14
- 13
- 12
- 11

METHOD OF MANUFACTURING SEMICONDUCTOR DEVICE

BACKGROUND OF THE INVENTION

1. Field of the Invention

This invention relates to a method of manufacturing a semiconductor device, and more particularly to a method of manufacturing a multilayer semiconductor device in which wiring metal films and via plugs electrically connecting the metal films are formed or contact plugs electrically connecting electrodes of various elements with the metal films.

2. Description of the Related Art

As semiconductor devices such as LSIs have been increased in integration, density and processing rate in recent years, it is a tendency that various elements and metal wirings are laminated one over another perpendicularly to a semiconductor substrate to form a multilayer structure. In such multilayer semiconductor devices, in order to make individual elements such as transistors and diodes in a lower layer operative, it is necessary to connect electrodes of the individual elements with metal wirings in an upper layer. For this purpose, holes called contact holes are formed in an interlayer insulation film which electrically insulates the individual layers from one another, and metal material is filled in the via holes to form metal pins called contact plugs, via which electrodes of various elements and the metal wirings of the lower upper layer are mutually connected.

Further, in the multilayer semiconductor devices, it is necessary to connect the metal wirings of the lower layer with those of the upper layer. For this purpose, holes called via holes are formed in an interlayer insulation film, and metal material is filled in the via holes to form metal pins called via plugs, via which the metal wirings of the lower layer and those of the upper layer are mutually connected.

Recently the increase of semiconductor device in integration, density and operating speed is reaching the stage of reducing the size of the contact holes and via holes. In the meantime, however, the thickness of the interlayer insulation film tends to increase due to the complexity of structure of a capacitor section to be formed on the semiconductor substrate and the flattening of the interlayer insulation film as by chemical and mechanical polishing (CMP). As a result, the aspect ratio indicating the ratio of the diameter (horizontal size) of the contact holes and of the via holes and the depth (vertical size) of the contact hole and of the via holes would be only around 2 in case of a DRAM whose memory capacity is 4 Mbit but it would be 4 or more in case of a DRAM whose memory capacity is 256 Mbit. This increase in aspect ratio necessitates to form contact plugs or via plugs by filling good step coverage in contact holes or via holes.

To meet this requirement, R. Fiordalice et al. presented a method entitled "A low temperature CVD Al plug and interconnect process for 0.25 µm metallization technologies" in 1996 Symposium on VLSI Technology Digest of Technical Papers, p. 42, 1996.

This method will now be described with reference to FIGS. 3(a) through 3(c) of the accompanying drawings of the present specification.

Firstly, an interlayer insulation film 2 as of silicon oxide ($SiO_2$) is formed on a semiconductor substrate 1 as of silicon (Si), whereupon contact holes 3 are opened as shown in FIG. 3(a), through steps of applying a resist, exposing, etching and peeling the resist. No element is illustrated either on the surface or inside the semiconductor substrate 1 for clarity in FIGS. 3(a) through 3(b); actually, however, various elements such as transistors are formed over which the interlayer insulation film 2 is formed.

Then a barrier metal film (not shown) as of titanium (Ti) is formed by physical vapor deposition (PVD) such as by sputtering, whereupon an aluminum film (hereinafter called the PVD-Al film) 4 is formed also by PVD as shown in FIG. 3(b). The barrier metal film is a foundation film for improving the tightness between the PVD-AL film 4 and the interlayer insulation film 2 and for preventing the connection from being broken due to mutual diffusion caused by reaction of raw material gas, which is used in chemical vapor deposition (CVD), with the semiconductor substrate 1 to form below-described contact plugs 6.

Then assuming that an aluminum film (hereinafter called the CVD-Al film) 5 is formed over the entire surface of the PVD-Al film 4 by CVD, as shown in FIG. 3(c), while it is kept in vacuum in the apparatus, the CVD-Al film 5 epitaxially grows on the PVD-Al film 4 to fill aluminum in the contact holes 3 to form the contact plugs 6.

In the above-mentioned conventional method, while the PVD-AL film 4 is formed, it deposits at the openings 3a of the contact holes 3 so as to reduce the size of the contact holes 3 as shown in FIG. 3(b). This phenomenon is called "overhanging", and such patterned portion of the PVD-AL film 4 is called an overhang 4a.

Since this overhang 4a exists, the openings 3a of the contact holes 3 are closed by the CVD-AL film 5 as shown in FIG. 3(c) before aluminum has been completely filled in the contact holes 3 while the CVD-Al film 5 is formed, so that voids 7 occur in the contact holes 3.

This occurrence of the voids 7 reduces the cross-sectional area of the contact plugs 6 and increases the current density of current to flow in the contact plugs 6, which would cause heat generation electromigration either resulting in wire breakage. Electromigration is a phenomenon in which metal atoms move along the flow of electrons in the wiring; breakage of the wiring occurs at its local portion where metal atoms have disappeared as they have moved, and shortcircuiting of the wiring occurs where metal atoms have been deposited adjacent to another wiring.

SUMMARY OF THE INVENTION

With the foregoing conventional problems in view, it is an object of this invention to provide a method of manufacturing a semiconductor device in which metal including aluminum can be completely filled in contact holes or via holes without occurrence of any void.

According to a first aspect of the invention, the above object is accomplished by a method of manufacturing a multilayer semiconductor device in which a plurality of metal wirings of individual layers are electrically interconnected via interlayer insulation films by via plugs, the method comprising: a first step of forming a lower-layer metal wiring over a semiconductor substrate; a second step of forming an interlayer insulation film over the entire top surface of the substrate; a third step of forming a first metal film, which includes aluminum, over the entire top surface of the interlayer insulation film by PVD (physical vapor deposition); a fourth step of etching the first metal film and the interlayer insulation film to open a hole, in which the via plugs are to be formed, to expose the lower-layer metal wiring; a fifth step of filling the hole with metal, which includes aluminum, by selective CVD (chemical vapor deposition) with a natural oxide film formed on the top surface of the first metal film as a mask, to form the via plugs; a sixth step of locally removing the natural oxide film by etching; and a seventh step of forming a second metal film, which includes aluminum, over the entire top surface of both the first metal film and the via plugs by CVD.

According to a second aspect of the invention, the above object is accomplished alternatively by a method of manufacturing a multilayer semiconductor device in which electrodes of individual constituent elements of the semiconductor device are electrically connected with a plurality of metal wirings of individual layers of the semiconductor device are electrically interconnected via interlayer insulation films by contact plugs, the method comprising: a first step of forming a lower-layer metal wiring over a semiconductor substrate; a second step of forming an interlayer insulation film over the entire top surface of the substrate; a third step of forming a first metal film, which includes aluminum, over the entire top surface of the interlayer insulation film by PVD (physical vapor deposition); a fourth step of etching the first metal film and the interlayer insulation film to open a hole, in which the contact plugs are to be formed, to expose the lower-layer metal wiring; a fifth step of filling the hole with metal, which includes aluminum, by selective CVD (chemical vapor deposition) with a natural oxide film formed on the top surface of the first metal film as a mask, to form the contact plugs; a sixth step of locally removing the natural oxide film by etching; and a seventh step of forming a second metal film, which includes aluminum, over the entire top surface of both the first metal film and the contact plugs by CVD.

According to a third aspect of the invention, the first step further includes forming a barrier metal film on at least an upper surface of the lower-layer metal wiring or at least an upper surface of the electrodes.

According to a fourth aspect of the invention, the barrier metal film is a film of solely tungsten or titanium, a film of tungsten compound or titanium compound, or a laminate film of these films.

According to a fifth aspect of the invention, the third step includes forming a 1000-angstrom-thickness aluminum film by d. c. sputtering under a condition in which a substrate temperature is 100° C., a flow rate of argon gas is 50–300 sccm (standard cubic centimeters per minute), a gas pressure of the argon gas is 1–10 mTorr, and a d. c. power is 5–30 kW.

According to a sixth aspect of the invention, the fifth step includes introducing hydrogen gas as carrier gas into the apparatus so as to be bubbled under a condition that a substrate temperature is 100° C.–270° C. and a pressure inside the apparatus is 0.1–10 Torr and a flow rate of 50–2000 sccm (standard cubic centimeters per minute).

According to a seventh aspect of the invention, the seventh step includes introducing hydrogen gas as carrier gas into the apparatus so as to be bubbled under a condition that a substrate temperature is 100° C.–300° C. and a pressure inside the apparatus is 0.1–30 Torr and a flow rate of 50–2000 sccm (standard cubic centimeters per minute).

According to an eighth aspect of the invention, the raw material gas in the fifth step is one selected from dimethylaluminum hydride, alkylaluminum and aluminum hydride.

According to a ninth aspect of the invention, the raw material gas in the seventh step is one selected from dimethylaluminum hydride, alkylaluminum and aluminum hydride.

According to a tenth aspect of the invention, the sixth step includes removing the natural oxide film by dry etching using chloride or chloride gas of boron trichloride.

According to an eleventh aspect of the invention, the seventh step is carried out while it is kept in vacuum inside the same apparatus as in the sixth step.

By the method of this invention, it is possible to fill the contact holes or via holes completely with metal including aluminum without occurrence of any void.

Further, since the second metal film is formed by CVD after the first metal film has been formed by PVD, the second metal film good both in crystal orientation and flatness epitaxially grows on the first metal film good in crystal orientation.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

The principles of this invention are particularly useful when applied to a method manufacturing a semiconductor device, one preferred embodiment of which will now be described in detail with reference to the accompanying drawings.

FIGS. 1(a) through 1(c), 2(a) and 2(b) show successive process steps of a semiconductor device manufacturing method according to one preferred embodiment of the invention.

Figure 1A:
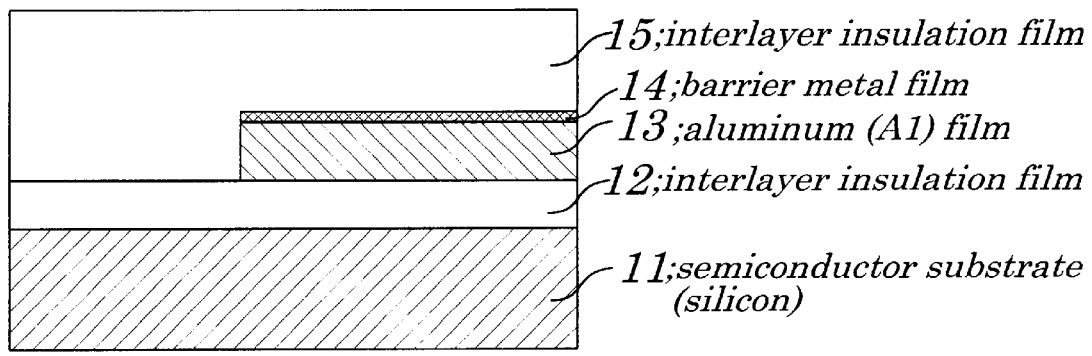
FIGS. 1(a) through 1(c) are process diagrams showing a method of manufacturing a semiconductor device according to one preferred embodiment of this invention.

As shown in FIG. 1(a), various elements such as non-illustrated transistors are formed on an upper surface and inside a semiconductor substrate 11 as of silicon (Si) by a standard semiconductor integrated circuit manufacturing method, whereupon a first interlayer insulation film 12 as of silicon oxide ($SiO_2$) is formed over the entire surface of the semiconductor substrate 11, then an aluminum (Al) film 13 and a barrier metal film 14, which constitutes a lower layer of metal wiring, are formed successively on part of the upper surface of the interlayer insulation film 12, and then a second interlayer insulation film 15 as of silicon oxide ($SiO_2$) is formed over the remaining part of the upper surface of the first interlayer insulation film 12 and also over the lower layer of metal wiring. The barrier metal film 14 is a laminate form of a 500-angstrom-thickness titanium nitride (TiN) film and a 300-angstrom-thickness titanium (Ti) film. Alternatively another barrier metal film may be formed also between the aluminum (Al) film 13 and the first interlayer insulation film. Further, the aluminum (Al) film 13 and the barrier metal film 14 may be formed by either PVD or CVD.

Figure 1B:
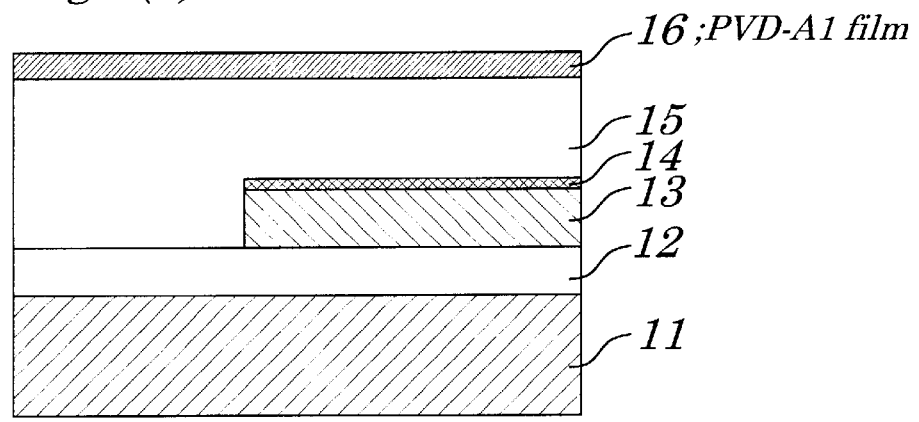
Figure 1C:
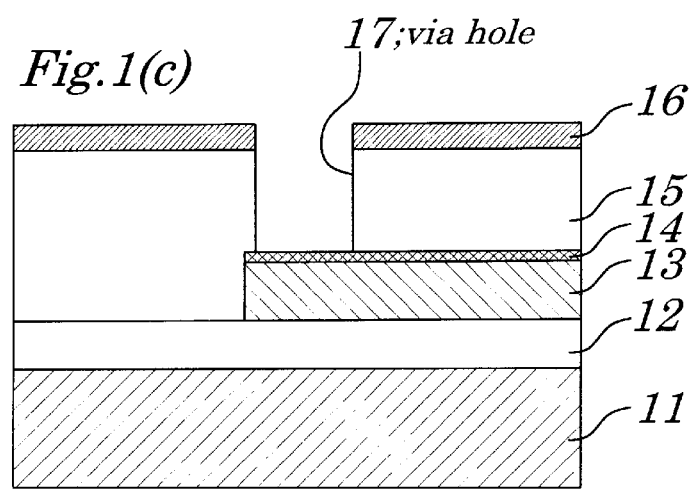

Then, as shown in FIG. 1(b), a 1000-angstrom-thickness PVD-Al film 16 is formed over the second interlayer insulation film 15 by PVD such as sputtering. D.c. sputtering may be carried out in a condition that a substrate temperature is 100° C., a flow rate of argon (Ar) gas is 50–300 sccm (standard cubic centimeter per minute, which means a flow rate in a standard state), a gas pressure of argon (Ar) gas is 1–10 mTorr and a d. c. power is 5–30 kW. When the resulting semiproduct is taken out from a PVD apparatus, it is exposed to atmosphere so that the PVD-AL film 16 formed as an upper layer of the semiproduct is oxidized by oxygen in atmosphere to form an aluminum oxide film ($Al_2O_3$) of approximately 1000 angstrom in thickness over the upper layer.

This aluminum oxide film is thus formed by a conventional process and is hence is called the natural oxide film. Then, after a resist pattern for via holes has been formed on the semiproduct, the PVD-Al film 16 is etched using the conventional lithography. Then, the second interlayer insulation film 15 is etched to open via holes 17 to thereby expose the titanium nitride film or the titanium film as the upper layer of the barrier metal film 14 (FIG. 1(c)).

Figure 2A:
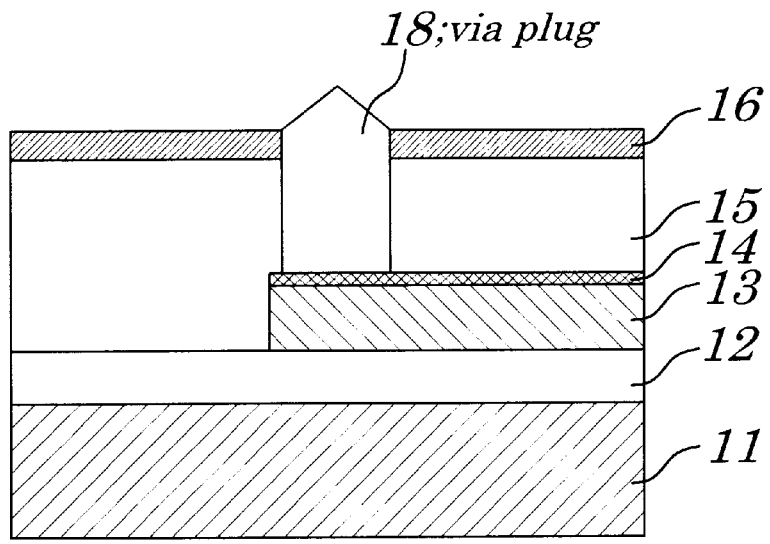
FIGS. 2(a) and 2(b) are process diagrams showing subsequent process steps of the method.
Figure 2B:
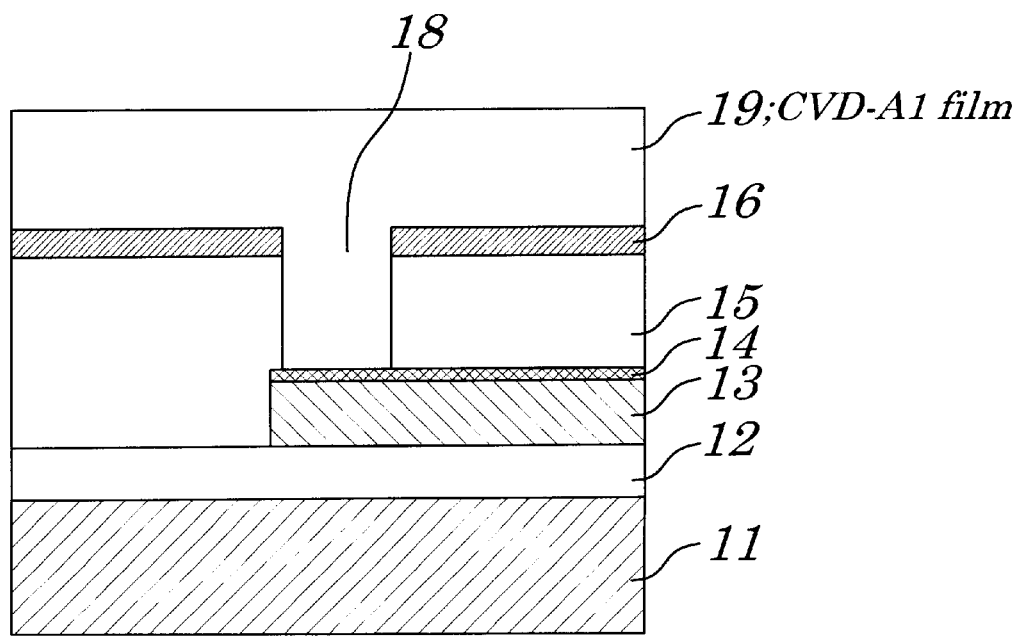
Figure 3A:
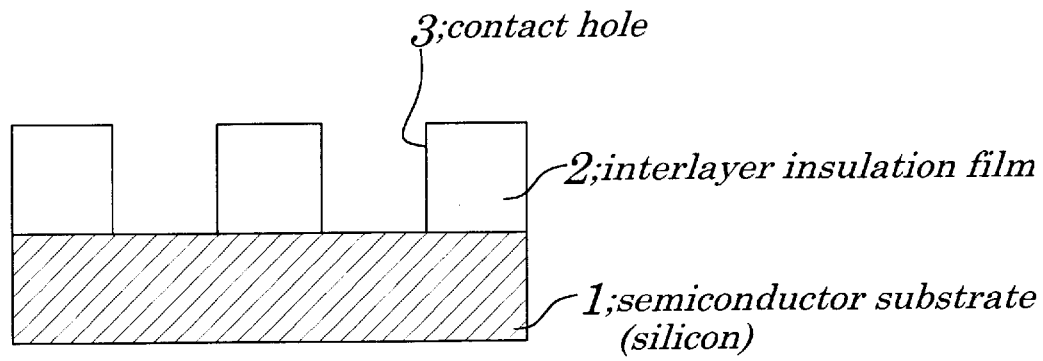
FIGS. 3(a) through 3(c) are process diagrams showing a conventional method of manufacturing a semiconductor device.
Figure 3B:
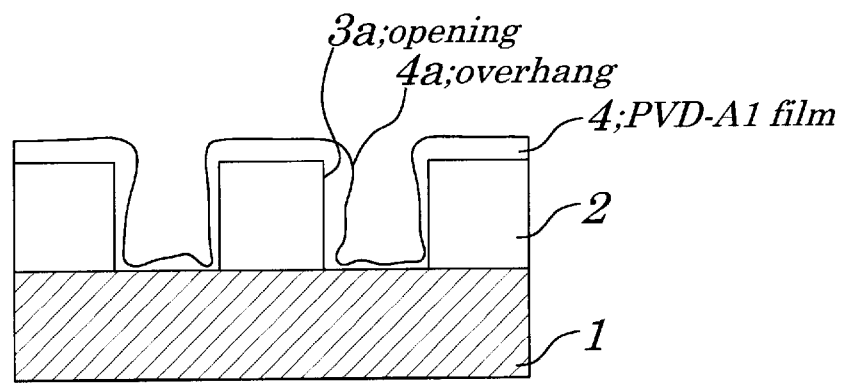
Figure 3C:
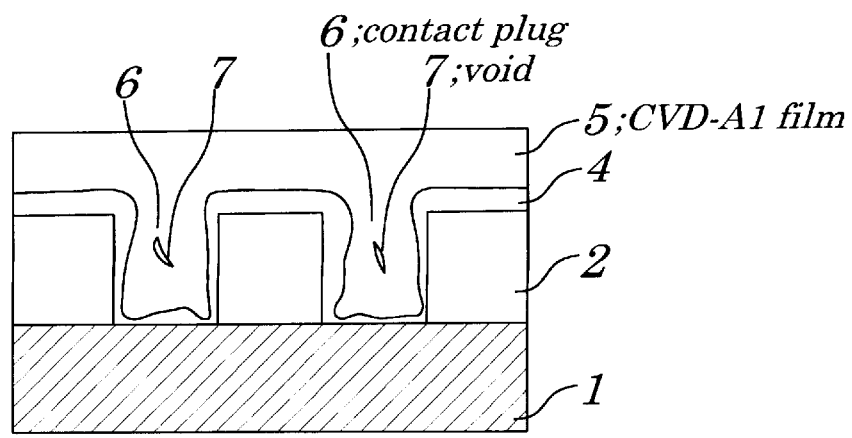

Then, as shown in FIG. 2(a), via plugs 18 of aluminum are formed only on the barrier metal 14 by selective CVD. In this selective CVD method, dimethylaluminum hydride (DMAH) $(CH_3)_2AlH$ is used as raw material gas, and hydrogen ($H_2$) gas as carrier gas is added to raw material liquid at a flow rate of 50–2000 sccm, whereupon the resulting material is introduced into the apparatus under a condition that a substrate temperature is 100° C.–270° C. and a gas pressure inside the apparatus is 0.1–10 Torr. As a result, a via plug 18 free of any void is formed from the barrier metal film 14 at the bottom of the individual via hole 17. The reason why the via plugs 18 are selectively formed is presumably that the aluminum oxide film, which is a natural oxide film, is inactive in response to the selective growth and therefore serves as a mask.

Subsequently, the aluminum oxide film formed on the surface of the PVD-Al film 16 is removed by dry etching using chloride gas such as chlorine ($Cl_2$) and boron trichloride ($BCl_3$), whereupon while it is kept in vacuum inside the same apparatus, a CVD-Al film 19 is formed over the entire surface of the PVD-Al film 16 by CVD so that the CVD-Al film 19 epitaxially grows on the PVD-Al film 16.

Dry etching is exemplified by reactive ion etching (RIE). Further, in the CVD method, dimethylaluminum hydride is used as raw material gas, and hydrogen gas is added to the liquidified raw material at a flow rate of 50–2000 sccm, whereupon the resulting bubbled material is introduced into the CVD apparatus under a condition that a substrate temperature is 100° C.–300° C. and a gas pressure inside the CVD apparatus is 0.1–30 Torr.

According to the foregoing manufacturing method, since the native oxide film inactive in response to the selective growth of aluminum serves as a mask, it is possible to selectively form via plugs 18 from the barrier metal film 14 at the bottom of the via holes 17 without occurrence of any void.

Further, according to this embodiment, since the PVD-Al film 16 formed by PVD, especially by sputtering, orients with respect to a lattice surface by good crystal orientation, the CVD-Al film 19 epitaxially grows on the PVD-Al film 16, with the lattice surface being the surface of orientation, when the CVD-Al film 19 is formed using CVD method on the surface where the natural oxide film is removed. As a result, the CVD-Al film 19 good in both crystal orientation and flatness can be formed. This is because although the growth rate of a thin film to be formed as the upper layer depends on the crystal orientation of a thin film as the lower layer, it is possible to form a thin film good in crystal orientation without making the surface uneven.

Accordingly, good alignment can be achieved in a lithography step, which is the next process step.

Further, as is already mentioned, since either the PVD-Al film 16 or the CVD-Al film 19 orients with the lattice surface being the surface of orientation, either film is high in resistance to electromigration. This is because generally a thin film oriented with respect to the lattice surface is very resistance to electromigration.

As is mentioned above, according to the semiconductor device manufacturing method of this invention, it is possible to completely fill metal including aluminum in either the contact holes or the via holes without occurrence of any void.

Further, since the second metal film is formed by chemical vapor deposition after the first metal film has been formed by physical vapor deposition, the second metal film good in both crystal orientation and flatness epitaxially grows on the first metal film good in crystal orientation.

Consequently it is possible to improve the yield and reliability of the semiconductor device.

It is thus apparent that the present invention should by no means be limited to the illustrated embodiment and various modifications and changes may be suggested without departing from the scope and spirit of the invention.

For example, in the embodiment, when the via plugs 18 and the CVD-Al film 19 are formed by the selective CVD method or the CVD method, raw material gas should by no means be limited to dimethylaluminum hydride and may alternatively be alkyl aluminum, such as triisobutylaluminum $(C_4H_9)_3Al$, or aluminum hydride amine adduct, such as $(CH_3)_3NAlH_3$, $(CH_3)_3NH_3AlH_3N(CH_3)_3$, $(CH_3)_2(C_2H_5)NAlH_3$ with the same results.

Further, in the illustrated embodiment, the barrier metal film 14 should by no means be limited to a laminate of a titanium nitride film and a titanium film and may alternatively be a film of solely refractory metal such as tungsten (W) or titanium (Ti) or its compound, or one selected from various laminates of these films in view of resistance value or reactivity with the aluminum film.

Furthermore, this invention should by no means be limited to the illustrated method in which the via plugs 18 are to be formed and may be applied to an alternative method in which contact plugs are to be formed, with the same results.

Finally, the present application claims the priority of Japanese Patent Application No. Hei9-288292 filed Oct. 21, 1997, which is herein incorporated by reference.

What is claimed is:

1. A method of manufacturing a multilayer semiconductor device in which a plurality of metal wirings of individual layers are electrically interconnected via interlayer insulation films by via plugs, said method comprising:

(a) a first step of forming a lower-layer metal wiring over a semiconductor substrate;

(b) a second step of forming an interlayer insulation film over the entire top surface of said substrate;

(c) a third step of forming a first metal film, which includes aluminum, over the entire top surface of said interlayer insulation film by PVD (physical vapor deposition);

(d) a fourth step of etching said first metal film and said interlayer insulation film to open a hole, in which said via plugs are to be formed, to expose said lower-layer metal wiring;

(e) a fifth step of filling said hole with metal, which includes aluminum, by selective CVD (chemical vapor deposition) with a native oxide film formed on the top surface of said first metal film as a mask, to form said via plugs;

(f) a sixth step of locally removing said native oxide film by etching; and (g) a seventh step of forming a second metal film, which includes aluminum, over the entire top surface of both said first metal film and said via plugs by CVD.

2. A method according to claim 1, wherein said first step further includes forming a barrier metal film on at least an upper surface of said lower-layer metal wiring.

3. A method according to claim 2, wherein said barrier metal film is a film of solely tungsten or titanium, a film of tungsten compound or titanium compound, or a laminate film of these films.

4. A method according to claim 1, wherein said third step includes forming a 1000-angstrom-thickness aluminum film by d. c. sputtering under a condition in which a substrate temperature is 100° C., a flow rate of argon gas is 50–300 sccm (standard cubic centimeters per minute), a gas pressure of said argon gas is 1–10 mTorr, and a d. c. power is 5–30 kW.

5. A method according to claim 1, wherein said fifth step includes introducing hydrogen gas as carrier gas into a manufacturing apparatus so as to be bubbled under a condition that a substrate temperature is 100° C.–270° C. and a pressure inside the apparatus is 0.1–10 Torr and a flow rate of 50–2000 sccm (standard cubic centimeters per minute).

6. A method according to claim 1, wherein said seventh step includes introducing hydrogen gas as carrier gas into a manufacturing apparatus so as to be bubbled under a condition that a substrate temperature is 100° C.–300° C. and a pressure inside the apparatus is 0.1–30 Torr and a flow rate of 50–2000 sccm (standard cubic centimeters per minute).

7. A method according to claim 1, wherein said raw material gas in said fifth step is one selected from dimethylaluminum hydride, alkylaluminum and aluminum hydride.

8. A method according to claim 1, wherein said raw material gas in said seventh step is one selected from dimethylaluminum hydride, alkylaluminum and aluminum hydride.

9. A method according to claim 1, where in said sixth step includes removing said natural oxide film by dry etching using chloride or chloride gas of boron trichloride.

10. A method according to claim 1, wherein said seventh step is carried out while it is kept in vacuum inside the same CVD apparatus as in said sixth step.

11. A method of manufacturing a multilayer semiconductor device in which electrodes of individual constituent elements of the semiconductor device are electrically connected with a plurality of metal wirings of individual layers of the semiconductor device are electrically interconnected via interlayer insulation films by contact plugs, said method comprising:

(a) a first step of forming a lower-layer metal wiring over a semiconductor substrate;

(b) a second step of forming an interlayer insulation film over the entire top surface of said substrate;

(c) a third step of forming a first metal film, which includes aluminum, over the entire top surface of said interlayer insulation film by PVD (physical vapor deposition);

(d) a fourth step of etching said first metal film and said interlayer insulation film to open a hole, in which said contact plugs are to be formed, to expose said lower-layer metal wiring;

(e) a fifth step of filling said hole with metal, which includes aluminum, by selective CVD (chemical vapor deposition) with a native oxide film formed on the top surface of said first metal film as a mask, to form said contact plugs;

(f) a sixth step of locally removing said native oxide film by etching; and (g) a seventh step of forming a second metal film, which includes aluminum, over the entire top surface of both said first metal film and said contact plugs by CVD.

12. A method according to claim 11, wherein said first step further includes forming a barrier metal film on at least an upper surface of said lower-layer metal wiring.

13. A method according to claim 12, wherein said barrier metal film is a film of solely tungsten or titanium, a film of tungsten compound or titanium compound, or a laminate film of these films.

14. A method according to claim 11, wherein said third step includes forming a 1000-angstrom-thickness aluminum film by d. c. sputtering under a condition in which a substrate temperature is 100° C., a flow rate of argon gas is 50–300 sccm (standard cubic centimeters per minute), a gas pressure of said argon gas is 1–10 mTorr, and a d. c. power is 5–30 kW.

15. A method according to claim 11, wherein said fifth step includes introducing hydrogen gas as carrier gas into a manufacturing apparatus so as to be bubbled under a condition that a substrate temperature is 100° C.–270° C. and a pressure inside the apparatus is 0.1–10 Torr and a flow rate of 50–2000 sccm (standard cubic centimeters per minute).

16. A method according to claim 11, wherein said seventh step includes introducing hydrogen gas as carrier gas into a manufacturing apparatus so as to be bubbled under a condition that a substrate temperature is 100° C.–300° C. and a pressure inside the apparatus is 0.1–30 Torr and a flow rate of 50–2000 sccm (standard cubic centimeters per minute).

17. A method according to claim 11, wherein said raw material gas in said fifth step is one selected from dimethylaluminum hydride, alkylaluminum and aluminum hydride.

18. A method according to claim 11, wherein said raw material gas in said seventh step is one selected from dimethylaluminum hydride, alkylaluminum and aluminum hydride.

19. A method according to claim 11, wherein said sixth step includes removing said natural oxide film by dry etching using chloride or chloride gas of boron trichloride.

20. A method according to claim 11, wherein said seventh step is carried out while it is kept in vacuum inside the same apparatus as in said sixth step.

* * * * *